United States Patent
Hwang et al.

(10) Patent No.: US 10,184,984 B2
(45) Date of Patent: Jan. 22, 2019

(54) INTEGRATED CIRCUIT AND ELECTRONIC APPARATUS INCLUDING INTEGRATED CIRCUIT

(71) Applicant: SAMSUNG ELECTRONICS CO., LTD., Suwon-si, Gyeonggi-Do (KR)

(72) Inventors: Hyun-Chul Hwang, Suwon-si (KR); Dae-Seong Lee, Busan (KR); Min-Su Kim, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 33 days.

(21) Appl. No.: 15/140,720

(22) Filed: Apr. 28, 2016

(65) Prior Publication Data

US 2017/0003343 A1    Jan. 5, 2017

(30) Foreign Application Priority Data

Jun. 30, 2015  (KR) .................. 10-2015-0093231

(51) Int. Cl.
*G01R 31/28* (2006.01)
*G01R 31/3185* (2006.01)

(52) U.S. Cl.
CPC ........... *G01R 31/318572* (2013.01); *G01R 31/318541* (2013.01)

(58) Field of Classification Search
CPC ............................................. G01R 31/318572
See application file for complete search history.

(56) References Cited

U.S. PATENT DOCUMENTS

| 6,073,260 | A  | * | 6/2000  | Kurita ............ G01R 31/318552 |
|           |    |   |         | 714/724 |
| 6,895,540 | B2 |   | 5/2005  | Chen et al. |
| 7,345,519 | B2 |   | 3/2008  | Hirata |
| 7,649,395 | B2 |   | 1/2010  | Ahmadi |
| 7,941,720 | B2 | * | 5/2011  | Mikami ........... G01R 31/31858 |
|           |    |   |         | 714/727 |
| 8,099,644 | B2 | * | 1/2012  | Huang ................ H03M 13/116 |
|           |    |   |         | 714/752 |
| 8,441,279 | B2 | * | 5/2013  | Lee ..................... H03K 19/003 |
|           |    |   |         | 326/16 |
| 8,493,119 | B2 |   | 7/2013  | Leach et al. |
| 8,566,657 | B2 | * | 10/2013 | Goel ............. G01R 31/318544 |
|           |    |   |         | 714/729 |

(Continued)

FOREIGN PATENT DOCUMENTS

| JP | 2003-068860 | 3/2003 |
| JP | 2007-218748 | 8/2007 |

(Continued)

*Primary Examiner* — Esaw T Abraham
(74) *Attorney, Agent, or Firm* — F. Chau & Associates, LLC (57) ABSTRACT

An integrated circuit and an electronic apparatus including the same. The electronic apparatus includes a scan input processing circuit, a selection circuit and a scanning circuit. The scan input processing unit is configured to output one of a scan input and a first logical value in response to a scan enable signal. The selection unit is configured to select one of an output of the scan input processing unit or a data input in response to the scan enable signal. The scan element comprises a flip-flop configured to store an output of the selection unit.

20 Claims, 12 Drawing Sheets

(56) References Cited

U.S. PATENT DOCUMENTS

| | | | |
|---|---|---|---|
| 8,957,717 B2* | 2/2015 | Kim | G01R 31/318541 |
| | | | 327/202 |
| 9,046,574 B2* | 6/2015 | Giles | G01R 31/318544 |
| 9,110,141 B2* | 8/2015 | Lin | G01R 31/318541 |
| 9,244,124 B2* | 1/2016 | Alvarez-Icaza Rivera | ............ |
| | | | G01R 31/318558 |
| 9,322,878 B2* | 4/2016 | Sato | G01R 31/318536 |
| 2013/0103993 A1* | 4/2013 | Ohtake | G11C 29/10 |
| | | | 714/720 |
| 2014/0189453 A1 | 7/2014 | Gurumurthy | |
| 2015/0113344 A1* | 4/2015 | Morton | G01R 31/318566 |
| | | | 714/727 |
| 2015/0331044 A1* | 11/2015 | Jajodia | G01R 31/3177 |
| | | | 714/727 |

FOREIGN PATENT DOCUMENTS

| | | |
|---|---|---|
| JP | 2008-172156 | 7/2008 |
| JP | 2009-192461 | 8/2009 |
| JP | 2012-231290 | 11/2012 |
| JP | 2013-036960 | 2/2013 |
| KR | 10-0595534 | 7/2006 |

\* cited by examiner

INTEGRATED CIRCUIT AND ELECTRONIC APPARATUS INCLUDING INTEGRATED CIRCUIT

CROSS-REFERENCE TO RELATED APPLICATION

This application claims the benefit of Korean Patent Application No. 10-2015-0093231, filed on Jun. 30, 2015, in the Korean Intellectual Property Office, the disclosure of which is herein incorporated by reference in its entirety.

TECHNICAL FIELD

The inventive concept relates to an integrated circuit and an electronic apparatus including the same, and more particularly, to an integrated circuit for minimizing an increase of a layout area or reliably performing an operation and an electronic apparatus including the integrated circuit.

DISCUSSION OF RELATED ART

As the memory storage capacity of integrated circuits ICs increases, the possibility of having manufacturing defects in the device increases. A scan chain is used for testing the design of an IC. The scan chain is used to set and observe every flip-flop in an IC.

SUMMARY

According to an exemplary embodiment of the inventive concept, an electronic apparatus includes a scanning circuit. The scanning circuit includes a scan input processing circuit, a selection circuit and a flip-flop. A scan input processing unit outputs one of a scan input and a first logical value in response to a scan enable signal. A selection unit selects one of an output of the scan input processing circuit or a data input in response to the scan enable signal. A flip-flop stores an output of the selection unit.

According to an exemplary embodiment of the inventive concept, an integrated circuit includes a scanning circuit. The scanning circuit includes a NAND gate, an OR-AND-INVERT (OAI) gate and a flip-flop. The NAND gate receives a scan enable signal and an inverted scan input. The OR-AND-INVERT (OAI) gate receives an output of the NAND gate, the scan enable signal, and a data input. The flip-flop stores an output of the OAI gate.

According to an exemplary embodiment of the inventive concept, an electronic apparatus includes a scan input processing circuit, a selection circuit and a flip-flop. The scan input processing circuit inverts and outputs an inverted scan input or output a logic value based on a scan enable signal. The selection circuit receives an output from the scan input processing circuit and outputs a data input or the output from the scan input processing circuit based on the scan enable signal. The flip-flop stores an output of the selection circuit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

The inventive concept will be described more fully with reference to the accompanying drawings, in which exemplary embodiments of the inventive concept are shown. Like reference numerals in the drawings denote like elements.

Figure 1:
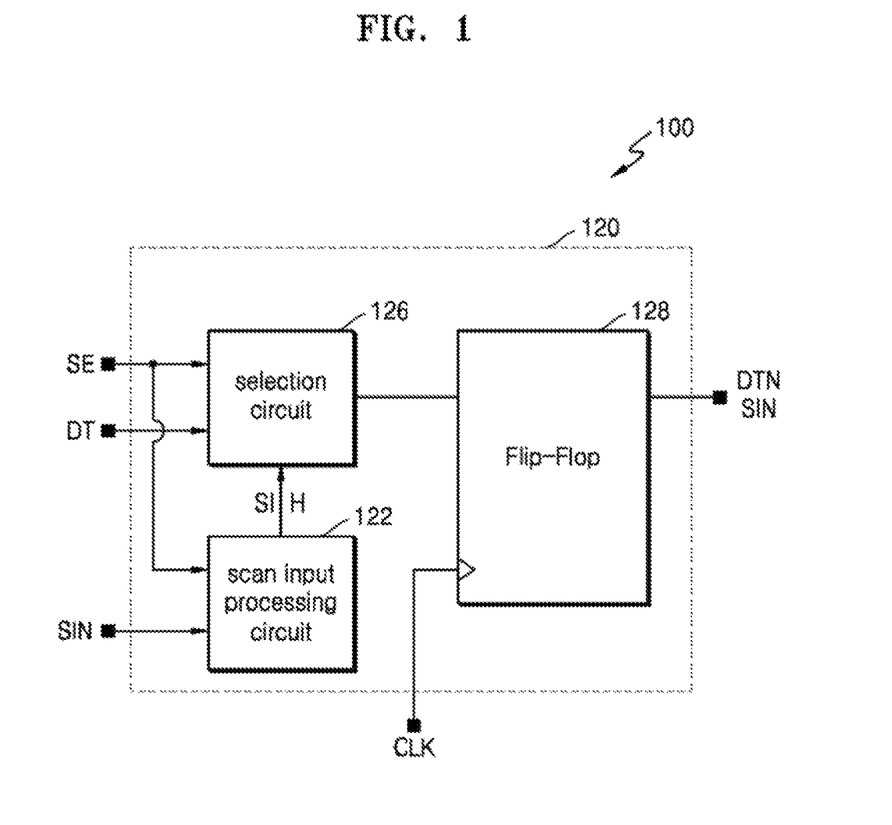
FIGS. 1 and 2 respectively illustrate integrated circuits according to exemplary embodiments.
Figure 2:
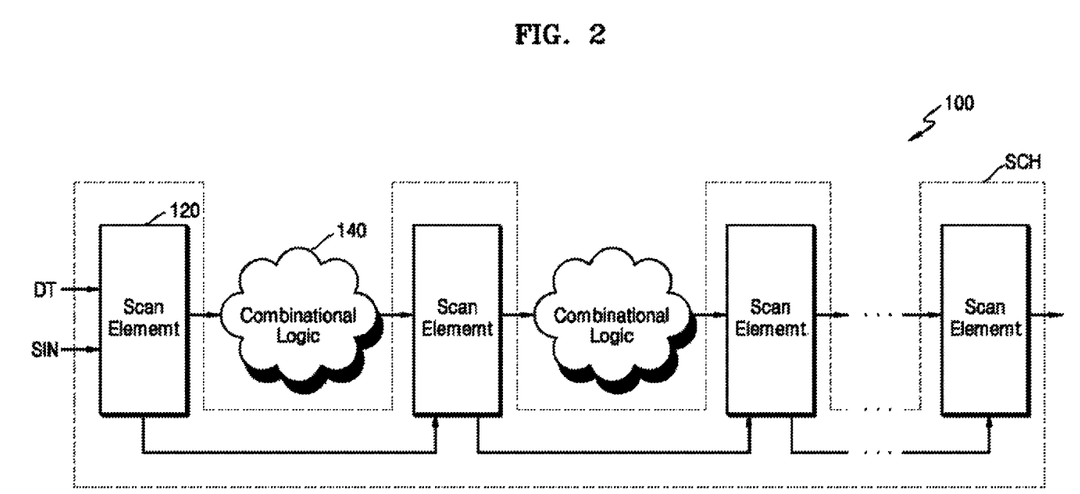

FIGS. 1 and 2 respectively illustrate integrated circuits according to exemplary embodiments. Referring to FIGS. 1 and 2, an electronic apparatus 100 includes multiple scan elements 120, e.g. a scanning circuit. The scan elements 120 are connected to each other in series and may form a scan chain SCH. A combinational logic 140 for processing a data input DT used for a normal operation may be located between the scan elements 120. Hereinafter, a mode in which a normal operation is performed will be referred to as a normal mode, and a mode in which a scan operation is performed will be referred to as a scan mode.

The scan element 120 receives, stores, and outputs the data input DT or an inverted scan input SIN, which is the inverse of a scan input SI, through a serial scan shift operation. The scan input SI may be a test pattern. For example, a setup time and a hold time for the scan elements 120 have to be secured. The setup time and hold time are set based on a clock signal CLK received by the scan element 120. The setup time is a period during which a scan input SI or an inverted scan input SIN has to be constantly maintained before the clock signals CLKs are transited. The hold time is a period during which an inverted scan input SIN or an inverted scan input SIN has to be constantly maintained after a clock signal CLK transitions to logic high H. When a data input DT is used, the setup time and the hold time have to be secured as well.

Each of the scan elements 120 includes a scan input processing unit 122, e.g. a scan input processing circuit, a selection unit 126, e.g. a selection circuit, and a flip-flop 128. The scan input processing unit 122 receives an inverted scan input SIN. The scan input processing unit 122 may invert the inverted scan input SIN to output a scan input SI or may output a first logical value in response to a scan enable signal SE. FIG. 1 illustrates that the first logical value output by the scan input processing unit is a logic high H. A logic high H may correspond to a binary 1 or a voltage between a voltage supply VDD and ⅔ of the voltage supply VDD. The selection unit 126 selects one of an output of the scan input processing unit 122 or the data input DT in response to the scan enable signal SE. The selection unit 126 may select the output of the scan input processing unit 122, and output an inverted scan input SIN or a scan input SI. Furthermore, the selection unit 126 may select the data input DT, and output an inverted data input DTN or a data input DT.

In the scan mode, the scan enable signal SE may be a logic high H. A logic level of the inverted scan input SIN is opposite to that of the scan input SI, and a logic level of the data input DTN is opposite to that of the data input DT.

The flip-flop 128 stores an output of the selection unit 126. For example, the flip-flop 128 stores the output of the selection unit 126 for one cycle of a clock signal CLK. At the next clock cycle of the clock signal CLK, the flip-flop 128 transmits an inverted scan input SIN, which has been stored for one cycle of the clock signal CLK, to a scan element located at the next terminal of the scan chain SCH. For example, the flip-flop 128 transmits the inverted data input DTN, which has been stored for one cycle of the clock signal CLK, to the combinational logic 140 at a next cycle of the clock signal CLK. The flip-flop may be implemented as a D flip-flop or a CMOS flip-flop. The D flip-flop may be implemented with NAND gates or NOR gates.

The combinational logic 140 outputs information stored in the combinational logic 140 as data input DT in response to the inverted data input DTN. The data input DT, which is output from the combinational logic 140 and input to a next terminal of the scan chain SCH, may not be related to the inverted data input DTN input to the combinational logic 140.

FIGS. 3 to 7 illustrate scan elements according to exemplary embodiments.

Figure 3:
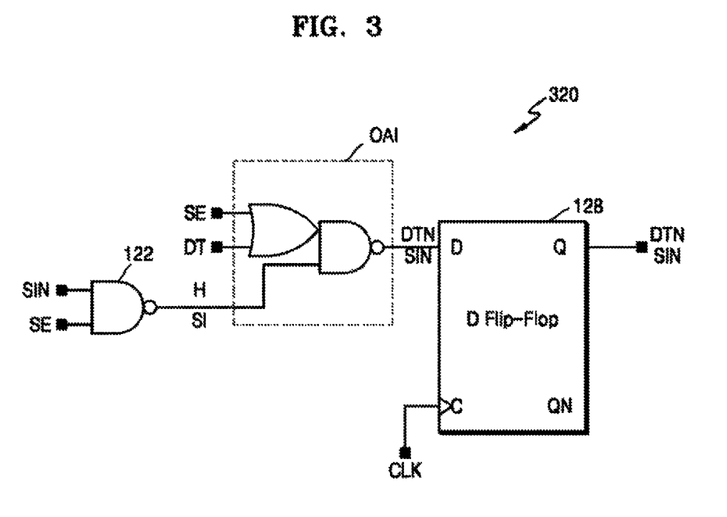
FIGS. 3 to 7 respectively illustrate scan elements according to exemplary embodiments.

FIG. 3 illustrates a scan element 320, e.g. a scanning circuit, according to an exemplary embodiment. Referring to FIGS. 1 and 3, a scan input processing unit 122 of the scan element 320 may be implemented as a NAND gate. An inverted scan input SIN and a scan enable signal SE are input to the NAND gate of the scan input processing unit 122. The selection unit 126 may be implemented as an OR AND Invert gate (OAI) gate. The OAI gate OAI is a 2-level combinational logic and may be implemented by combining an OR gate and a NAND gate. A scan enable signal SE, a data input DT, and an output of the scan input processing unit 122 are input to the OAI gate OAI.

When the scan enable signal SE is set to logic low L, e.g. a normal mode, the NAND gate of the scan input processing unit 122 may output logic high H regardless of a value of the inverted scan input SIN. A logic low L may correspond to a binary 0 or a voltage between a ground voltage GND and ⅓ of the voltage supply VDD. In this case, the OAI gate OAI inversely outputs the data input DT. An inverted data input DTN is input to a flip-flop 128. FIG. 3 illustrates an example of implementing the flip-flop 128 as a D flip-flop. The inverted data input DTN is input to a terminal D of the flip-flop 128 during a random pulse of a clock signal CLK. The inverted data input DTN is output from terminal Q during the next pulse of the clock signal CLK. The clock signal CLK is applied to terminal C of the flip-flop 128. The scan element 320 transmits the inverted data input DTN from the output of the scan element 320 in the normal mode to the connected combinational circuit 140 (of FIG. 2).

When the scan enable signal SE is set to logic high H, e.g. the scan mode, the NAND gate of the scan input processing unit 122 inverts the inverted scan input SIN and outputs the scan input SI to the OAI gate OAI. The OAI gate OAI outputs the inverted scan input SIN when the scan enable signal SE is the logic high H. Therefore, the inverted scan input SIN is input into terminal D of the flip-flop 128 during a random pulse of the clock signal CLK. The inverted scan input SIN is output from terminal Q during a following pulse of the clock signal CLK. The scan element 320 transmits the inverted scan input SIN to the next scan element in the scan chain SCH.

Figure 4:
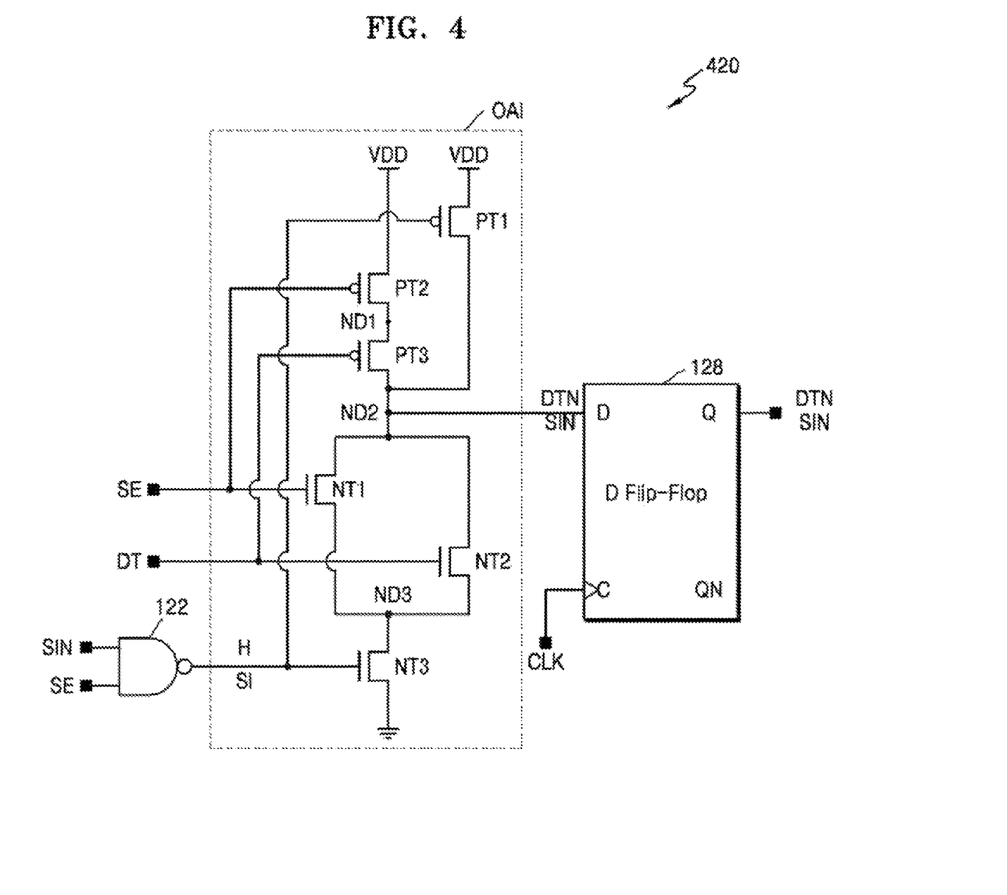

FIG. 4 illustrates a scan element 420, e.g. a scanning circuit, according to an exemplary embodiment. Referring to FIG. 4, the scan element 420 may be implemented as the NAND gate of the scan input processing unit 122 like the scan element 320 of FIG. 3. The inverted scan input SIN and the scan enable signal SE are input to the NAND gate of the scan input processing unit 122. The selection unit 126 may be implemented as the OAI gate OAI. Also, the flip-flop 128 may be implemented as the D flip-flop.

The OAI gate OAI of FIG. 4 may include three P-channel metal oxide semiconductor (PMOS) transistors and three N-channel metal oxide semiconductor (NMOS) transistors. An end of the first PMOS transistor PT1, e.g. the source, is connected to a voltage supply VDD, and the other end thereof, e.g. the drain, is connected to a second node ND2. An end of the second PMOS transistor PT2, e.g. the source, is connected to the voltage supply VDD, and the other end thereof, e.g. the drain, is connected to a first node ND1. The third PMOS transistor PT3 is connected between the first node ND1 and the second node ND2 with the first end, e.g. the source, connected to ND1 and the second end, e.g. the drain, connected to ND2. The first NMOS transistor NT1 and the second NMOS transistor NT2 are connected to each other in parallel with transistor NT1 and NT2 connected to the second node ND2 at their first end, e.g. the drain, and connected to a third node ND3 at their second end, e.g. the source. An end of the third NMOS transistor NT3, e.g. the drain, is connected to the third node ND3, and the other end thereof, e.g. the source, is connected to a ground terminal.

The gates of the first PMOS transistor PT1 and the third NMOS transistor NT3 are connected to the scan input processing unit 122. The gates of the second PMOS transistor PT2 and the first NMOS transistor NT1 receive a scan enable signal SE. The gates of the third PMOS transistor PT3 and the second NMOS transistor NT2 receive a data input DT.

When the scan enable signal SE is set to logic low L in the normal mode, the NAND gate of the scan input processing unit 122 outputs logic high H regardless of the inverted scan input SIN. The gate of the second PMOS transistor PT2 is turned on by the scan enable signal SE, and the gate of the first NMOS transistor NT1 is turned off. The gates of the first PMOS transistor PT1 and the third NMOS transistor NT3 are connected to the signal output from the scan input processing unit 122. When the first PMOS transistor PT1 is turned on the third NMOS transistor NT3 is turned off. When the data input DT is logic high H the third PMOS transistor PT3 is turned off, and the second NMOS transistor NT2 is turned on. This combination causes a voltage of logic low L to be applied to the second node ND2. When the data input DT is the logic low L, the third PMOS transistor PT3 is turned on, and the second NMOS transistor NT2 is turned off so that a voltage of the logic high H is applied to the second node ND2. In the normal mode the inverted data input DTN is transmitted to a terminal D of the flip-flop 128 and is output via a terminal Q of the flip-flop 128.

The gates of the second PMOS transistor PT2 and the first NMOS transistor NT1 receive the scan enable signal SE. When the scan enable signal SE is set to the logic high H in the scan mode, the second PMOS transistor PT2 is turned off, and the first NMOS transistor NT1 is turned on. The scan input processing unit 122 may output an inverse of the inverted scan input SIN, e.g. the scan input SI, in the scan mode. When the scan input SI is logic high H in the scan mode, the first PMOS transistor PT1 is turned off, and the third NMOS transistor NT3 is turned on. Regardless of the state of the third PMOS transistor PT3 and the second NMOS transistor NT2 controlled by the data input DT, a voltage of logic low L is applied to the second node ND2.

In the scan mode, when the scan input SI is logic low L, the first PMOS transistor PT1 is turned on, and the third NMOS transistor NT3 is turned off. Regardless of the state of the third PMOS transistor PT3 and the second NMOS transistor NT2 controlled by the data input DT, a voltage of logic high H is applied to the second node ND2. Accordingly, in the scan mode, the inverted scan input SIN is applied to the terminal D of the flip-flop 128 and is output via the terminal Q of the flip-flop 128.

The inverted scan input SIN or the inverted data input DTN is transmitted to the terminal D of the flip-flop 128 connected to the second node ND2. The OAI gate OAI may be implemented differently from the illustration of FIG. 4. For example, unlike the illustration of FIG. 4, the gates of the second PMOS transistor PT2 and the first NMOS transistor NT1 may receive the data input DT, and the gates of the third PMOS transistor PT3 and the second NMOS transistor NT2 may receive the scan enable signal SE. Descriptions of other operations of the scan element 420 of FIG. 4 are substantially the same as the descriptions provided with reference to FIG. 3, and thus, details thereof will not be further provided.

Figure 5:
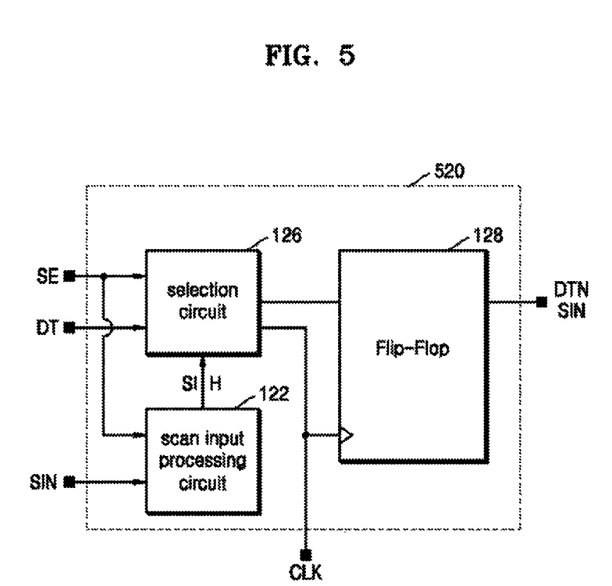

FIG. 5 illustrates a scan element 520, e.g. a scanning circuit, according to an exemplary embodiment. Referring to FIGS. 1 and 5, the scan element 520 of FIG. 5 may include the scan input processing unit 122 e.g. the scan input processing circuit, the selection unit 126 e.g. the selection circuit, and the flip-flop 128 like the scan element 120 of FIG. 1. The selection unit 126 of the scan element 520 may operate together with the flip-flop 128 in synchronization with the clock signal CLK.

Figure 6:
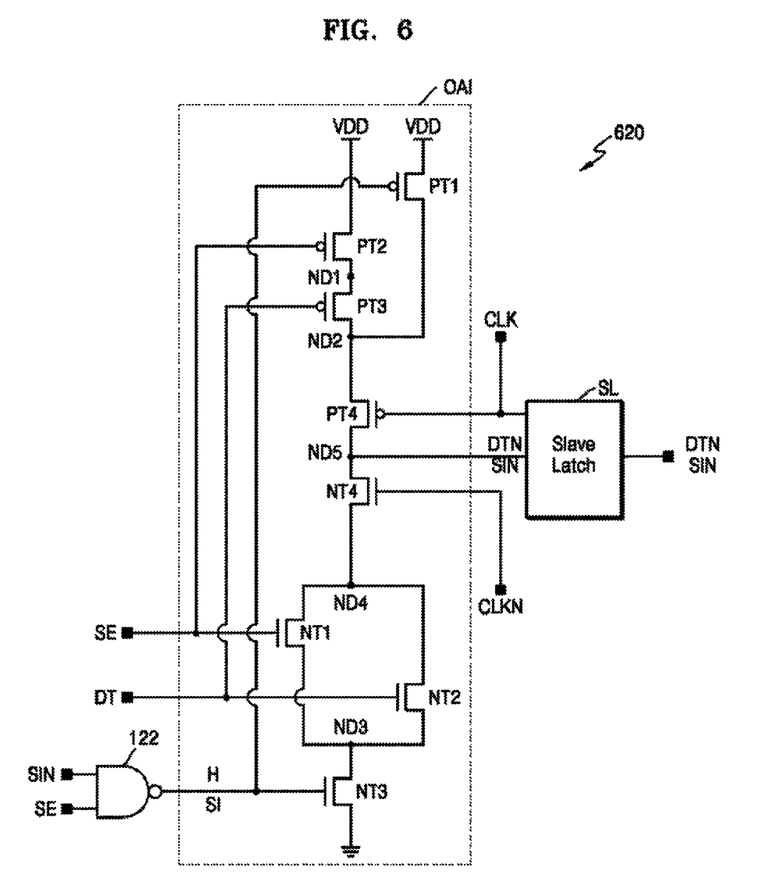

FIG. 6 illustrates a scan element 620, e.g. a scanning circuit, according to an exemplary embodiment. Referring to FIG. 6, the scan input processing unit 122 may be implemented as the NAND gate. The inverted scan input SIN and the scan enable signal SE are input to the NAND gate of the scan input processing unit 122. The selection unit 126 may be implemented as the OAI gate OAI.

The OAI gate OAI of FIG. 6 may include three PMOS transistors PT1 to PT3 and three NMOS transistors NT1 to NT3. A first end of the PMOS transistor PT1, e.g. the source, is connected to the voltage supply VDD, and the other end, e.g. the drain, is connected to the second node ND2. An end of the second PMOS transistor PT2, e.g. the source, is connected to the voltage supply VDD, and the other end, e.g. the drain, is connected to the first node ND1. The third PMOS transistor PT3 is connected between the first node ND1 and the second node ND2 with the first end, e.g. the source, connected to ND1 and the second end, e.g. the drain, connected to ND2. The first NMOS transistor NT1 and the second NMOS transistor NT2 are connected to each other in parallel with transistor NT1 and NT2 connected to the third node ND3 at their first end, e.g. the drain, and connected to a fourth node ND4 at their second end, e.g. the source. An end of the third NMOS transistor NT3, e.g. the drain, is connected to the third node ND3, and the other end, e.g. the source, is connected to the ground terminal.

The gates of the first PMOS transistor PT1 and the third NMOS transistor NT3 are connected to the signal output from the scan input processing unit 122. The gates of the second PMOS transistor PT2 and the first NMOS transistor NT1 are connected to the scan enable signal SE. The gates of the third PMOS transistor PT3 and the second NMOS transistor NT2 receive the data input DT. The OAI gate OAI of FIG. 6 may further include a fourth PMOS transistor PT4 and a fourth NMOS transistor NT4 connected in series between the second node ND2 and the fourth node ND4. The first end of the fourth PMOS transistor PT4, e.g. the source, is connected to the second node ND2 and the second end of fourth PMOS transistor PT4, e.g. the drain, is connected to a fifth node ND5. The first end of the fourth NMOS transistor NT4, e.g. the source, is connected to the fourth node ND4 and the second end of fourth NMOS transistor NT4, e.g. the drain, is connected to the fifth node ND5. The gates of the fourth PMOS transistor PT4 and the fourth NMOS transistor NT4 are connected to an inverted clock signal CLKN and a clock signal CLK, respectively.

When the scan enable signal SE is set to logic low L in the normal mode, the NAND gate of the scan input processing unit 122 outputs logic high H regardless of a value of the inverted scan input SIN in an arbitrary pulse of the clock signal CLK. The gate of the second PMOS transistor PT2 receives the scan enable signal SE, and the gate of the first NMOS transistor NT1 receives the scan enable signal SE. When the scan enable signal SE is set to logic low L in the normal mode, the second PMOS transistor PT2 is turned on and the first NMOS transistor NT1 is turned off. Also, the gate of the first PMOS transistor PT1 is connected to the signal output from the scan input processing unit 122, and the gate of the third NMOS transistor NT3 is connected to the signal output from the scan input processing unit 122. In this situation, the first PMOS transistor PT1 is turned off and the third NMOS transistor NT3 is turned on.

When the data input DT is logic high H, the third PMOS transistor PT3 is turned off, and the second NMOS transistor NT2 is turned on so that the logic low L is applied to the fifth node ND5. In a further example, when the data input DT is logic low L, the third PMOS transistor PT3 is turned on, and the second NMOS transistor NT2 is turned off resulting in the logic high H being applied to the fifth node ND5.

When the clock signal CLK is logic high H, the fourth PMOS transistor PT4 and the fourth NMOS transistor NT4 are turned on, and a voltage of the fifth node ND5 is applied to a slave latch SL. In the normal mode, the inverted data input DTN is output from the scan element 620.

When the scan enable signal SE is set to logic high H in the scan mode, the second PMOS transistor PT2, gated by the scan enable signal SE, is turned off, and the first NMOS transistor NT1, gated by the scan enable signal SE, is turned on. Also, the scan input processing unit 122 outputs an inverse of the inverted scan input SIN, in the scan mode. In the scan mode, when the scan input SI is logic high H, the first PMOS transistor PT1 of the OAI gate OAI is turned off, and the third NMOS transistor NT3 is turned on. Regardless of the state of the third PMOS transistor PT3 and the second NMOS transistor NT2 gated by the data input DT, logic low L is applied to the fifth node ND5. In a further example, when the scan input SI is logic low L in the scan mode the first PMOS transistor PT1 is turned on, and the third NMOS transistor NT3 is turned off. Regardless of the state of the third PMOS transistor PT3 and the second NMOS transistor NT2 logic high H is applied to the fifth node ND5.

When the clock signal CLK is logic high H, the fourth PMOS transistor PT4 and the fourth NMOS transistor NT4 are not turned on, and a voltage at the fifth node ND5 is applied to the slave latch SL. In the scan mode, the inverted scan input SIN is output from the scan element 620.

When the OAI gate OAI is as illustrated in FIG. 6, the flip-flop 128 of FIG. 5 may be implemented as a slave latch SL. The OAI gate OAI may be embodied differently from the illustration of FIG. 6. In the example above the selection unit 126 has been implemented as the OAI gate OAI, but the inventive concept is not limited to this example. Hereinafter, different embodiments of the selection unit 126 will be described.

Figure 7:
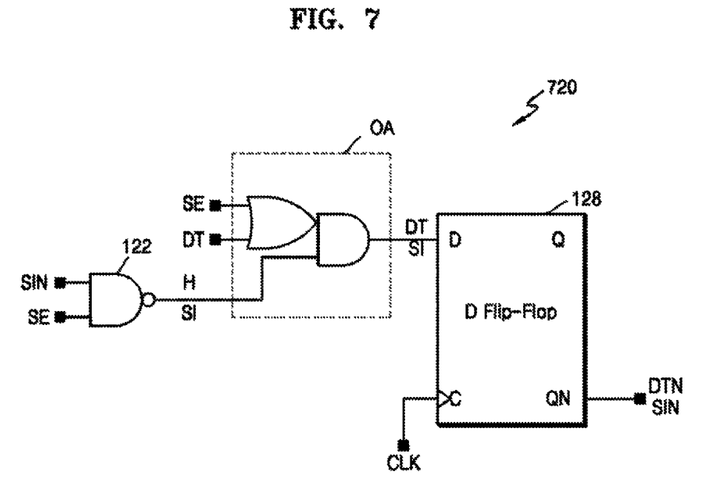

FIG. 7 illustrates a scan element 720, e.g. a scanning circuit, according to another exemplary embodiment. Referring to FIGS. 1 and 7, a scan input processing unit 122 of the scan element 720 may be implemented as a NAND gate. An inverted scan input SIN and a scan enable signal SE are input to the NAND gate of the scan input processing unit 122. The selection unit 126 may be implemented as an OR AND (OA) gate OA. The OA gate OA is a 2-level combinational logic and may be implemented by combining an OR gate and an AND gate. A scan enable signal SE, a data input DT, and an output of the scan input processing unit 122 are input to the OA gate OA.

An operation of the scan element 720 of FIG. 7 is similar to the operation of the scan element 120 of FIG. 3. In the normal mode, unlike the OAI gate OAI of FIG. 3, the OA gate OA does not invert the data input DT and transmits the data input DT to the flip-flop 128. The flip-flop 128 receives the data input DT at the terminal D. The flip-flop 128 outputs the inverted data input DTN from terminal QN. In the scan mode, unlike the OAI gate OAI of FIG. 3, the OA gate OA transmits the scan input SI, instead of the inverted scan input SIN, to the flip-flop 128. The terminal QN of the flip-flop 128 is an inverted output terminal for inversing and outputting an input transmitted to the terminal D.

As described above, the electronic apparatus 100 includes the scan input processing unit 122, that may be implemented as a NAND gate to sufficiently maintain the scan input SI or inverted scan input SIN during a hold time and does not include an inverted element for inversing a scan enable signal within a scan element, and thus, the electronic apparatus 100 holds the scan input SI, etc. during the hold time and may have an optimal layout area. The scan element 120 of FIG. 1, etc. has been mainly described based on a case where the scan enable signal SE is input, but the inventive concept is not limited thereto.

Figure 8:
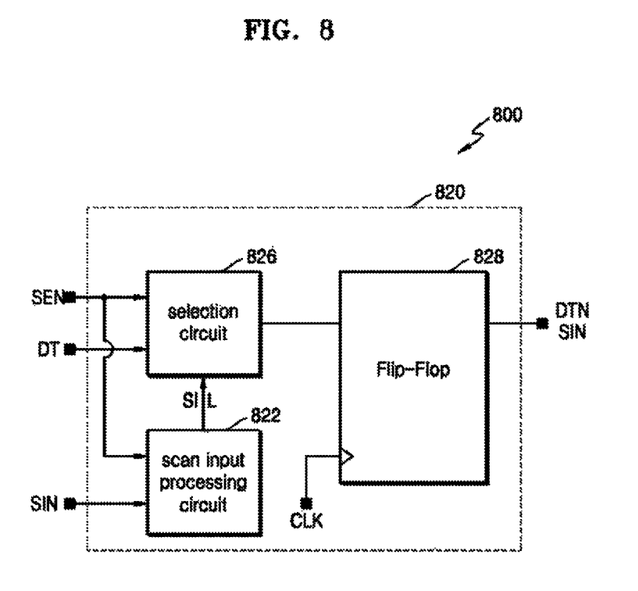
FIG. 8 illustrates an integrated circuit according to an exemplary embodiment.

FIG. 8 illustrates an integrated circuit 800 according to another exemplary embodiment. Referring to FIG. 8, a scan element 820, e.g. a scanning element, includes a scan input processing unit 822, e.g. a scan input processing circuit, a selection unit 826, e.g. a selection circuit, and a flip-flop 828. The scan input processing unit 822 receives an inverted scan input SIN. The scan input processing unit 822 inverts an inverted scan input SIN to output a scan input SI. The scan input processing unit 822 may output a data input DT as an inverted data input DTN, e.g. a first logical value, in response to an inverted scan enable signal SEN. FIG. 8 illustrates an example in which the first logical value is logic low L. The selection unit 826 selects one of an output of the scan input processing unit 822 and the data input DT in response to the inverted scan enable signal SEN. The selection unit 826 may output the inverted scan input SIN or the scan input SI when the output of the scan input processing unit 822 is selected. In a further example, when the selection unit 826 selects the data input DT, the selection unit 126 may output the inverted data input DTN or the data input DT. The inverted scan enable signal SEN is a signal having a logic level different from that of the scan enable signal SE of FIG. 1. The inverted scan enable signal SEN may be transmitted as the logic low L in the scan mode.

The flip-flop 828 stores an output from the selection unit 826 for one cycle of the clock signal CLK. For example, an inverted scan input SIN stored in the flip-flop 828 for one cycle of the clock signal CLK may be transmitted to a scan element 820 located at a next terminal of the scan chain SCH of FIG. 2 for a next cycle of the clock signal CLK. In a further example, the data input DT stored in the flip-flop 828 for one cycle of the clock signal CLK is transmitted to the combinational logic 140 of FIG. 2 in a next cycle of the clock signal CLK.

FIG. 8 illustrates that the inverted scan enable signal SEN is transmitted to the scan element 820, but the inventive concept is not limited thereto. As illustrated in FIG. 1, after the scan enable signal SE is transmitted, the scan enable signal SE may be inverted by an inverter included in the scan element 820.

Figure 9:
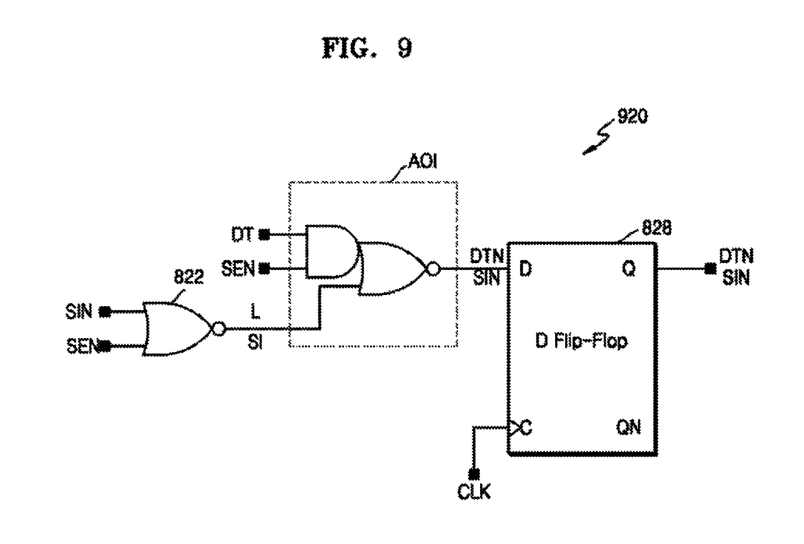
FIGS. 9 and 10 illustrate scan elements according to exemplary embodiments.

FIG. 9 illustrates an example of the scan element 820 of FIG. 8. Referring to FIGS. 8 and 9, the scan input processing unit 822 of the scan element 920, e.g. a scanning circuit, may be implemented as a NOR gate. An inverted scan input SIN and an inverted scan enable signal SEN are transmitted to the NOR gate of the scan input processing unit 822. The selection unit 826 may be implemented as an AND OR Invert (AOI) gate AOI. The AOI gate AOI is a 2-level combinational logic and may be implemented by combining an AND gate and an OR inverter (the NOR gate). An inverted scan enable signal SEN, a data input DT, and an output of the scan input processing unit 822 are transmitted to the AOI gate AOI.

When the inverted scan enable signal SEN is set to logic high H in the normal mode, the NOR gate of the scan input processing unit 822 outputs logic low L regardless of a value of the inverted scan input SIN. The AOI gate AOI transmits an inverted data input DTN to the flip-flop 828. As illustrated in FIG. 3, the flip-flop 828 may be implemented as a D flip-flop. The inverted data input DTN is input to a terminal D of the flip-flop 828 is output through a terminal Q in a next pulse of the clock signal CLK. The clock signal CLK is transmitted through a terminal C of the flip-flop 828. The scan element 920 transmit the inverted data input DTN to the combinational logic 140 of FIG. 2 connected to the scan element 920, in the normal mode.

When the inverted scan enable signal SEN is set to the logic low L in the scan mode, the NOR gate of the scan input processing unit 822 outputs the scan input SI formed by inverting the inverted scan input SIN. Since the inverted scan enable signal SEN is the logic low L, the AOI gate AOI outputs the inverted scan input SIN. The inverted scan input SIN is input to the flip-flop 828. The inverted scan input SIN is input to the terminal D of the flip-flop 828 during a random pulse of the clock signal CLK is output from the terminal Q in a next pulse. In the scan mode, the scan element 920 transmits the inverted scan input SIN to a scan element located at a next terminal.

Figure 10:
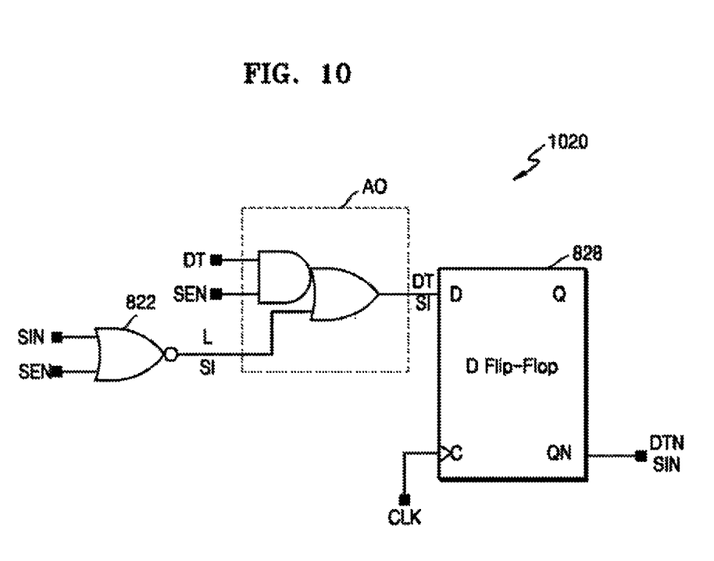

FIG. 10 illustrates another example of the scan element 820 of FIG. 8. Referring to FIGS. 8 and 10, a scan input processing unit 822 of a scan element 1020, e.g. a scanning circuit, may be implemented as a NOR gate. An inverted scan input SIN and an inverted scan enable signal SEN are input to the NOR gate of the scan input processing unit 822. A selection unit 826 may be implemented as an AND OR (AO) gate AO. The AO gate AO is a 2-level combinational logic and may be implemented by combining an AND gate and an OR inverter. An inverted scan enable signal SEN, a data input DT, and an output of the scan input processing unit 822 are transmitted to the AO gate AO.

When the inverted scan enable signal SEN is set to logic high H in the normal mode, the NOR gate of the scan input processing unit 822 outputs logic low L regardless of a value of the inverted scan input SIN. The AO gate AO transmits a data input DT to the flip-flop 828. As illustrated in FIG. 10, the flip-flop 828 may be implemented as the D flip-flop. The inverted data input DTN is input to the terminal D of the flip-flop 828 is inverted and output through the terminal QN as the data input DT in a next pulse of the clock signal CLK. The clock signal CLK is transmitted through the terminal C of the flip-flop 828. The scan element 1020 transmits the inverted data input DTN to the combinational logic 140 of FIG. 2 connected to the scan element 1020 in the normal mode.

When the inverted scan enable signal SEN is set to the logic low L in the scan mode, the NOR gate of the scan input processing unit 822 outputs the scan input SI formed by inverting the inverted scan input SIN. Since the inverted scan enable signal SEN is the logic low L, the AO gate AO outputs a scan input SI. The scan input SI is input to the flip-flop 828. The scan input SI is input to the terminal D of the flip-flop 828 in an arbitrary pulse of the clock signal CLK is output from the terminal QN in a next pulse of the clock signal CLK. Through the above operation, in the scan mode, the scan element 1020 transmits the inverted scan input SIN to a scan element located at a next terminal.

Figure 11:
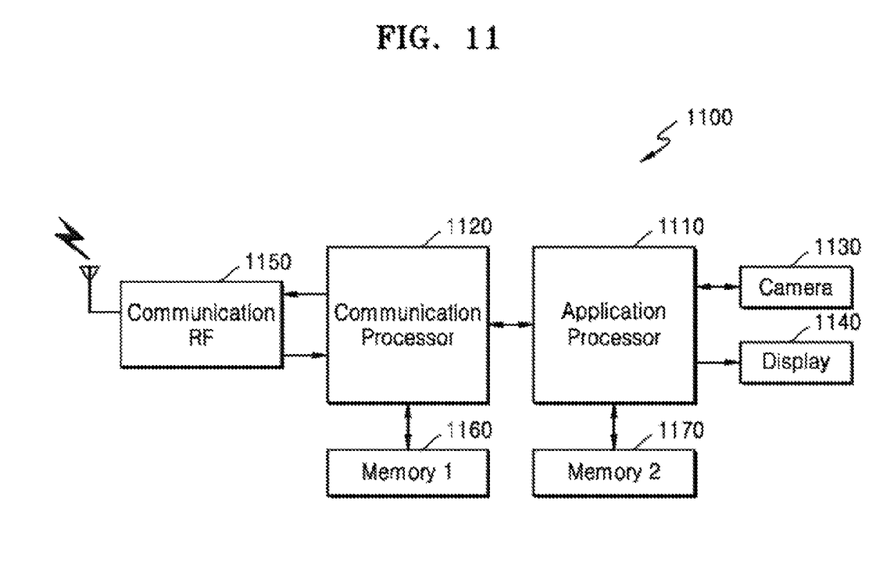
FIG. 11 illustrates a mobile apparatus according to an exemplary embodiment.

FIG. 11 illustrates a mobile apparatus 1100 according to an exemplary embodiment. Referring to FIG. 11, the mobile apparatus 1100 may include an application processor 1110 implemented as a system on chip (SOC), a communication processor 1120, a camera 1130, a display 1140, a communication radio (RF) 1150, and first and second memories 1160 and 1170 respectively. Applications may be executed by the application processor 1110 included in the mobile apparatus 1100. For example, when an image is captured by the camera 1130, the application processor 1110 may store the captured image in the second memory 1170 and may display the stored image on the display 1140.

The application processor 1110 may include the electronic apparatus 100 described with reference to FIG. 1. The captured image may be transmitted to the outside via the communication RF 1150 according to the communication processor 1120. For example, the communication processor 1120 may temporarily store the image in the first memory 1160 to transmit the image. The communication processor 1120 may further control phone calls and communication for reception and transmission of data.

Figure 12:
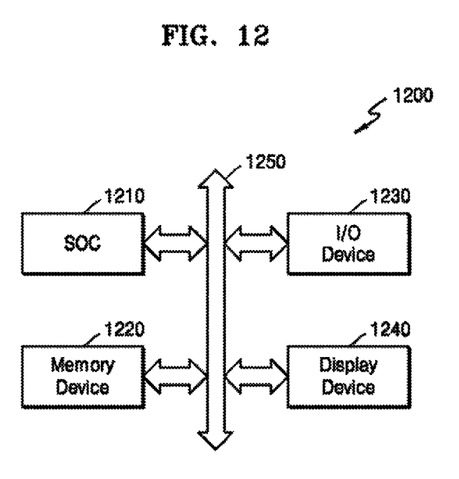
FIG. 12 illustrates a computing system according to an exemplary embodiment.

FIG. 12 illustrates a computing system 1200 according to an exemplary embodiment. Referring to FIG. 12, an SOC 1210, a memory device 1220, an input/output (I/O) device 1230, and a display device 1240 may be included in the computing system 1200. The computing system 1200 may be a mobile device, a desktop computer, or a server and may be electrically connected to a bus 1250.

The electronic apparatus 100 of FIG. 1 may be included in various electronic devices other than the computing system 1200 of FIG. 12. For example, the electronic apparatus 100 of FIG. 1 may be included in wearable apparatuses, home appliances, or the like.

While the inventive concept has been shown and described with reference to exemplary embodiments thereof, it will be understood that various changes in form and details may be made therein without departing from the spirit and scope of the following claims.

What is claimed is:

1. An electronic apparatus comprising:
   a scanning circuit comprising:
      a scan input processing circuit configured to receive a scan enable signal as an input and output one of a scan input and a first logical value through a single signal line based on a logic level of the received scan enable signal;
      a selection circuit configured to receive the scan enable signal as an input and select one of an output of the scan input processing circuit and data input based on the logic level of the received scan enable signal; and
      a flip-flop configured to store an output of the selection circuit.

2. The electronic apparatus of claim 1, wherein the scan input processing circuit comprises a NAND gate configured to receive the scan enable signal and an inverted scan input as inputs.

3. The electronic apparatus of claim 2, wherein the selection circuit comprises an OR-AND-INVERT (OAI) gate configured to receive an output of the NAND gate, the scan enable signal, and the data input.

4. The electronic apparatus of claim 2, wherein the scan input processing circuit inverts the inverted scan input to generate the scan input.

5. The electronic apparatus of claim 3, wherein, in a normal mode, the NAND gate outputs the first logical value of logic high, and the OAI gate outputs an inverted data input, wherein the logic high corresponds to a binary 1.

6. The electronic apparatus of claim 5, wherein the OAI gate inverts the data input to generate the inverted data input.

7. The electronic apparatus of claim 3, wherein, in a scan mode, the NAND gate outputs the scan input, and the OAI gate outputs the inverted scan input.

8. An electronic apparatus comprising:
   a scanning circuit comprising:
      a scan input processing circuit configured to receive an inverted scan enable signal as an input and output one of a scan input and a first logical value through a single signal line based on a logic level of the received inverted scan enable signal;
      a selection circuit configured to receive the inverted scan enable signal as an input and select one of an output of the scan input processing circuit and an inverted data input based on the logic level of the received inverted scan enable signal; and
      a flip-flop configured to store an output of the selection circuit.

9. The electronic apparatus of claim 3, wherein the OAI gate is synchronized with a clock signal, together with the flip-flop, and wherein the flip-flop and OAI gate each comprise:
   a first P-channel metal oxide semiconductor (PMOS) transistor that is gated by the output of the NAND gate wherein a first end of the first PMOS transistor is connected to a voltage supply;
   a second PMOS transistor that is gated by the scan enable signal, wherein a first end of the second PMOS transistor is connected to the voltage supply, and a second end of the second PMOS transistor is connected to a first node;
   a third PMOS transistor that is gated by the data input, wherein a first end of the third PMOS transistor is connected to the first node, and a second end of the third PMOS transistor is connected to a second end of the first PMOS transistor at a second node;
   a fourth PMOS transistor that is gated by an clock signal, wherein a first end of the fourth PMOS transistor is connected to the second node, and a second end of the fourth PMOS transistor is connected to a fifth node;
   a first N-channel MOS (NMOS) transistor that is gated by the scan enable signal, wherein a first end of the first NMOS transistor is connected to a third node, and a second end of the first NMOS transistor is connected to a fourth node;
   a second NMOS transistor that is gated by the output of the NAND gate, wherein a first end of the third NMOS transistor is connected to the third node, and a second end of the third NMOS transistor is connected to a ground terminal;

a fourth NMOS transistor that is gated by an inverted clock signal, wherein a first end of the fourth NMOS transistor is connected to the fourth node, and a second end of the fourth NMOS transistor is connected to the fifth node; and a slave latch configured to store a node voltage of the fifth node.

10. The electronic apparatus of claim 3, wherein the OAI gate comprises:

a first P-channel metal oxide semiconductor (PMOS) transistor that is gated by the output of the NAND gate, wherein a first end of the first PMOS transistor is connected to a voltage supply;

a second PMOS transistor that is gated by the scan enable signal, wherein a first end of the second PMOS transistor is connected to the voltage supply, and a second end of the second PMOS transistor is connected to a first node;

a third PMOS transistor that is gated by the data input, wherein a first end of the third PMOS transistor is connected to the first node, and a second end of the third PMOS transistor is connected to a second end of the first PMOS transistor at a second node;

a first N-channel MOS (MOS) transistor that is gated by the scan enable signal, wherein a first end of the first NMOS transistor is connected to the second node, and a second end of the first NMOS transistor is connected to a third node;

a second NMOS transistor that is gated by the data input, wherein a first end of the second NMOS transistor is connected to the second node, and a second end of the second NMOS transistor is connected to the third node; and a third NMOS transistor that is gated by the output of the NAND gate, wherein a first end of the third NMOS transistor is connected to the third node, and a second end of the third NMOS transistor is connected to a ground terminal.

11. The electronic apparatus of claim 10, wherein a voltage at the second node is applied to the flip-flop.

12. The electronic apparatus of claim 1, wherein the flip-flop comprises a D flip-flop.

13. The electronic apparatus of claim 8, wherein the scan input processing circuit comprises a NOR gate configured to receive the inverted scan enable signal and the inverted scan input as inputs.

14. The electronic apparatus of claim 13, wherein the selection circuit comprises an AND-OR-INVERT (AOI) gate configured to receive an output of the NOR gate, the inverted scan enable signal, and the data input.

15. The electronic apparatus of claim 14, wherein, in a normal mode, the NOR gate outputs the first logical value of logic low, and the AOI gate outputs the inverted data input, and in a scan mode, the NOR gate outputs the scan input, and the AOI gate outputs the inverted scan input.

16. The electronic apparatus of claim 1, wherein the selection circuit and the flip-flop are synchronized with a clock signal.

17. An electronic apparatus comprising:

a scanning circuit comprising:

a scan input processing circuit configured to output a scan input when a scan enable signal indicates a scan mode and output a logical value through a single signal line when the scan enable signal indicates a normal mode different from the scan mode;

a selection circuit configured to output the scan input when the enable signal indicates the scan mode, and output data based on the logical value when the scan enable signal indicates the normal mode; and a flip-flop configured to store an output of the selection circuit.

18. The electronic apparatus of claim 17, wherein the scan input processing circuit comprises a NAND gate receiving the scan enable signal and an inverted form of the scan input as inputs.

19. The electronic apparatus of claim 18, wherein the selection circuit comprises an OR-AND (OA) gate configured to receive an output of the NAND gate, the scan enable signal, and a data input.

20. The electronic apparatus of claim 17, wherein the scan input processing circuit comprises a NOR gate receiving an inverted form of the scan enable signal and an inverted form of the scan input as inputs, and the selection circuit comprises an AND-OR (AO) gate configured to receive an output of the NOR gate, the inverted form of the scan enable signal, and a data input.

* * * * *